US008912837B2

(12) United States Patent
De Caro et al.

(10) Patent No.: US 8,912,837 B2
(45) Date of Patent: Dec. 16, 2014

(54) MUX-BASED DIGITAL DELAY INTERPOLATOR

(71) Applicant: STMicroelectronics S.r.l., Agrate Brianza (MB) (IT)

(72) Inventors: Davide De Caro, Naples (IT); Fabio Tessitore, Grumo Nevano (IT); Antonio G. M. Strollo, Avellino (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 14/045,284

(22) Filed: Oct. 3, 2013

(65) Prior Publication Data

US 2014/0103986 A1    Apr. 17, 2014

(30) Foreign Application Priority Data

Oct. 12, 2012 (IT) .............................. MI2012A1720

(51) Int. Cl.
| | | |
|---|---|---|
| H03H 11/26 | (2006.01) | |
| H03K 5/14 | (2014.01) | |
| H03K 5/13 | (2014.01) | |
| H03K 5/00 | (2006.01) | |

(52) U.S. Cl.
CPC ................ H03K 5/14 (2013.01); H03K 5/131 (2013.01); H03K 2005/00052 (2013.01)
USPC ............ 327/276; 327/158; 327/261; 327/231

(58) Field of Classification Search
USPC ................ 327/231–291, 158, 159; 375/355
See application file for complete search history.

(56) References Cited

U.S. PATENT DOCUMENTS

| | | | | |
|---|---|---|---|---|
| 6,573,771 | B2 * | 6/2003 | Lee et al. ........................ | 327/158 |
| 6,642,760 | B1 * | 11/2003 | Alon et al. ..................... | 327/158 |
| 7,173,463 | B2 * | 2/2007 | Lee ................................ | 327/158 |
| 7,593,496 | B2 * | 9/2009 | Fan et al. ....................... | 375/355 |
| 7,825,710 | B2 * | 11/2010 | Kim et al. ...................... | 327/158 |
| 2003/0006817 | A1 | 1/2003 | Seo et al. | |
| 2008/0252349 | A1 | 10/2008 | Yun et al. | |
| 2012/0105122 | A1 | 5/2012 | Lee | |
| 2013/0335130 | A1 * | 12/2013 | Abramzon ..................... | 327/276 |

FOREIGN PATENT DOCUMENTS

EP    1229646 A2    8/2002

OTHER PUBLICATIONS

Jaeha Kim; Horowitz, M.A., "Adaptive supply serial links with sub-1-V operation and per-pin clock recovery," Solid-State Circuits, IEEE Journal of, vol. 37, No. 11, pp. 1403,1413, Nov. 2002.*

* cited by examiner

*Primary Examiner* — Lincoln Donovan
*Assistant Examiner* — Thomas Skibinski
(74) *Attorney, Agent, or Firm* — Allen, Dyer, Doppelt, Milbrath & Gilchrist, P.A.

(57) ABSTRACT

A digital delay interpolator may include an array of multiplexers, each multiplexer configured to be input with first and second input voltages, one of the first and second input voltages being delayed in respect to the other, and receive a respective selection signal. The digital delay interpolator may include output lines respectively coupled to the array of multiplexers, and an output terminal configured to be coupled in common to the output lines. Each multiplexer may be configured to selectively output on the respective output line one of the first and the second input voltages based upon a logic value of the respective selection signal.

19 Claims, 9 Drawing Sheets

US 8,912,837 B2

MUX-BASED DIGITAL DELAY INTERPOLATOR

TECHNICAL FIELD

The present disclosure relates to integrated circuits, and, more particularly, to a digital delay interpolator.

BACKGROUND

Digital delay interpolation is a method for performing a fine delay with a better resolution. FIG. 1 shows a prior art digital delay interpolator, disclosed in the U.S. Published Patent Application No. 2003/0006817. This delay interpolator comprises a plurality of delay stages to control delay time of an output signal from two input signals having different phase delays. The digital delay interpolator includes four delay stages (100-110-120-130) that have the same internal structure. The first delay stage 100 includes inverters 510, 520, 530, 540, a phase mixer 550, and a multiplexer 3×2 560. The input signals IN1 and IN2 are inverted by inverters 510, 520 that provide the inverted replicas thereof to the phase mixer 550. The phase mixer 550 includes inverters 552, 554 having outputs connected to each other, and generates the first phase mixing signal PB1 (see FIG. 2) having an intermediate phase between the signals IN1D and IN2D. The signals IN1D and IN2D are inverted by the inverters 530, 540 and the multiplexer 560 generates the output signals OUT1 and OUT2 by selecting one of signals outputted by the inverters 530, 540, and the phase mixed signal PB1. The delay stages 110, 120 and 130 are identical to the first delay stage 100.

With this architecture, the signal outputted from the fourth stage 130 has a delay resolution equal to $\Delta/16$, wherein $\Delta$ is the delay between the input signals IN1 and IN2 of the first stage 100. In order to obtain a resolution equal to $\Delta/2^K$, K stages in cascade are necessary. Therefore, the accuracy of this delay interpolator may be enhanced only by increasing the number of stages in cascade, that may cause relatively long propagation delays along the whole structure and a large power consumption.

SUMMARY

The present applicant has found that it is possible to realize a digital delay interpolator by using 2×1 multiplexers as building blocks connected in parallel to each other.

In particular, it has been found that it is possible to obtain any phase mixing resolution without connecting stages in cascade, with a single-stage digital delay interpolator, that may comprise an array of multiplexers, preferably identical to each other, configured to be input with first (IN1) and second (IN2) input voltages, one delayed in respect to the other. The multiplexers of the array may be configured to selectively output on respective output lines either the first (IN1) or the second (IN2) input voltage depending on the logic value of a respective selection signal and being configured such that their output lines are connected in common to an output line (SOUT) of the single-stage digital delay interpolator.

Optionally, in order to further enhance the resolution of the delay, it is possible to realize a mixed series-parallel architecture by connecting in cascade a plurality of stages each composed of multiplexers connected in parallel.

DETAILED DESCRIPTION OF THE PREFERRED EMBODIMENTS

For sake of clarity, in the ensuing description reference will be made to the case in which the digital delay interpolator illustratively includes a plurality of identical multiplexers, though similar observations hold mutatis mutandis if the multiplexers are different from each other.

The present disclosure provides a digital delay interpolator constructed by using 2×1 multiplexers as building blocks ("mux-based" digital delay interpolator). Differently from the typical digital delay interpolators discussed above, the digital delay interpolator of the present disclosure controls the delay time of an output signal, from two input signals having different phase delay, without using inverters. This may save a relevant amount of silicon area, as will be explained hereinafter.

Figure 1:
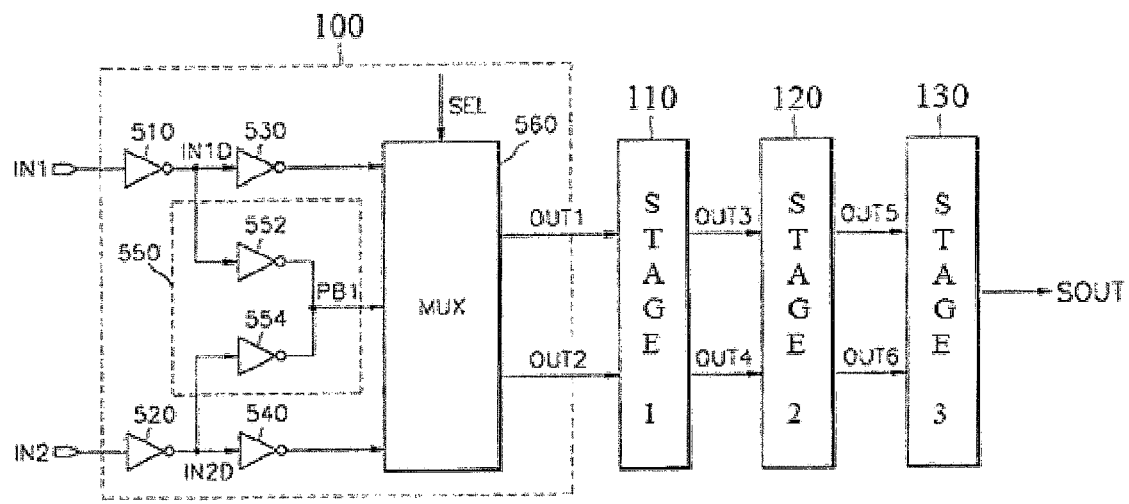
FIG. 1 is a diagram of a prior art digital delay interpolator.
Figure 2:
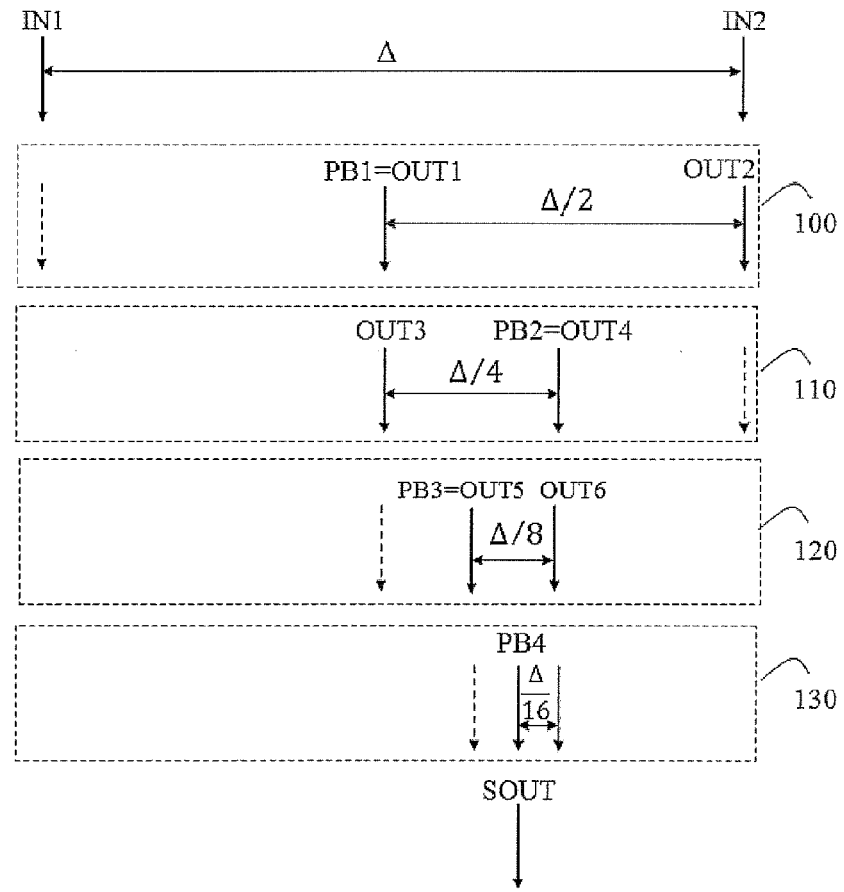
FIG. 2 is a time graph that schematically shows the output signals of the circuit depicted in FIG. 1.
Figure 3:
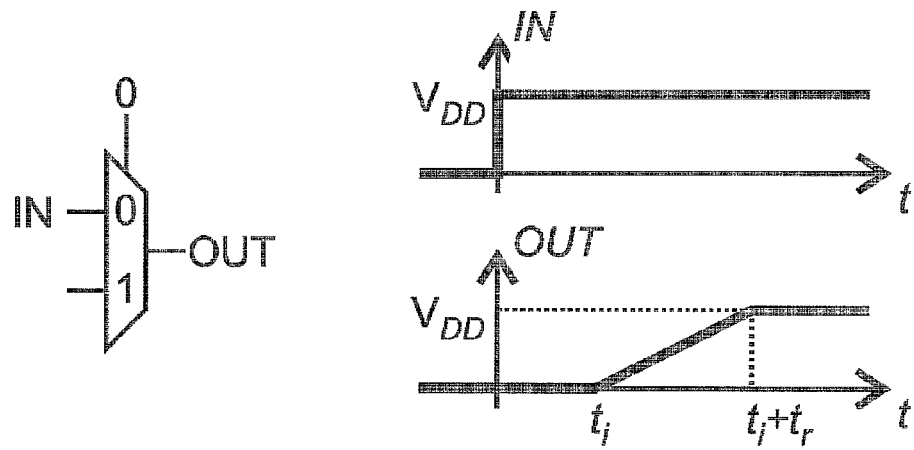
FIG. 3 depicts a two-input multiplexer and time graphs that illustrate its functioning.

Referring to FIG. 3, in order to understand how a digital delay interpolator can be realized using only multiplexers, a multiplexer and the graphs that illustrate its functioning are shown. When a selected input signal VIN undergoes to a step variation, the output signal VOUT of the multiplexer does not vary for a certain time ti, that represents the intrinsic delay of the multiplexer, then varies substantially linearly during a time interval tr, called rise-time of the multiplexer, as far as the output VOUT equals the supply voltage VDD. Therefore, the total delay time of the multiplexer td, i.e. the time elapsed from the instant at which the step variation of the selected input occurs and the instant at which the output VOUT overcomes VDD/2, is $$t_d = t_i + \frac{t_r}{2}.$$

The rise-time tr of the multiplexer is determined by the output capacitance of the multiplexer and by a pull-up/pull-down current delivered by the multiplexer for charging/discharging its output capacitance.

Figure 4:
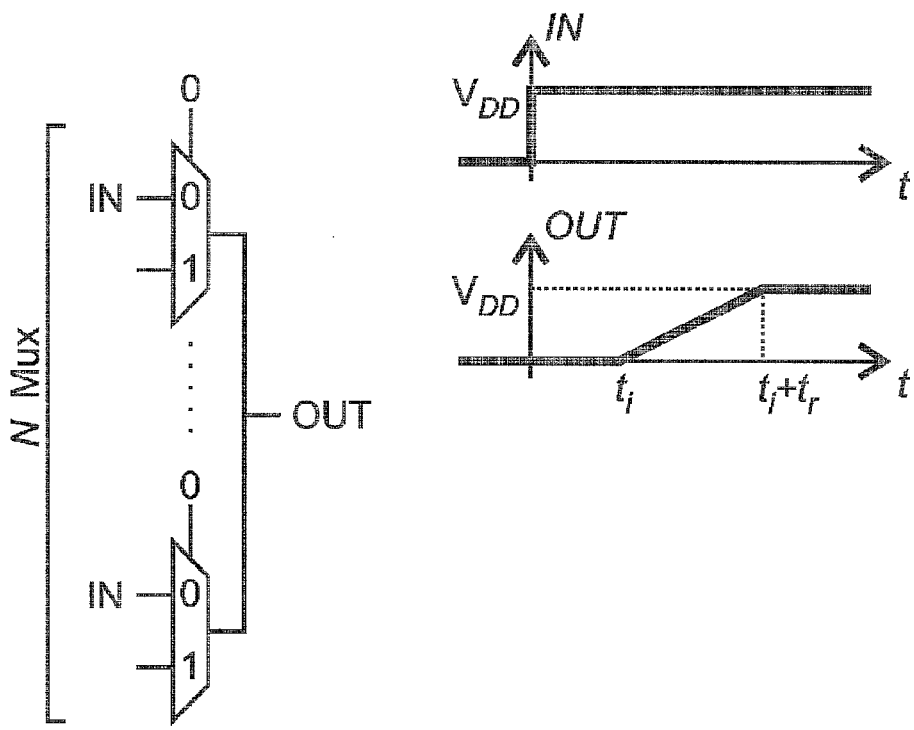
FIG. 4 depicts a parallel connection of N two-input multiplexers and associated time graphs.
Figure 5:
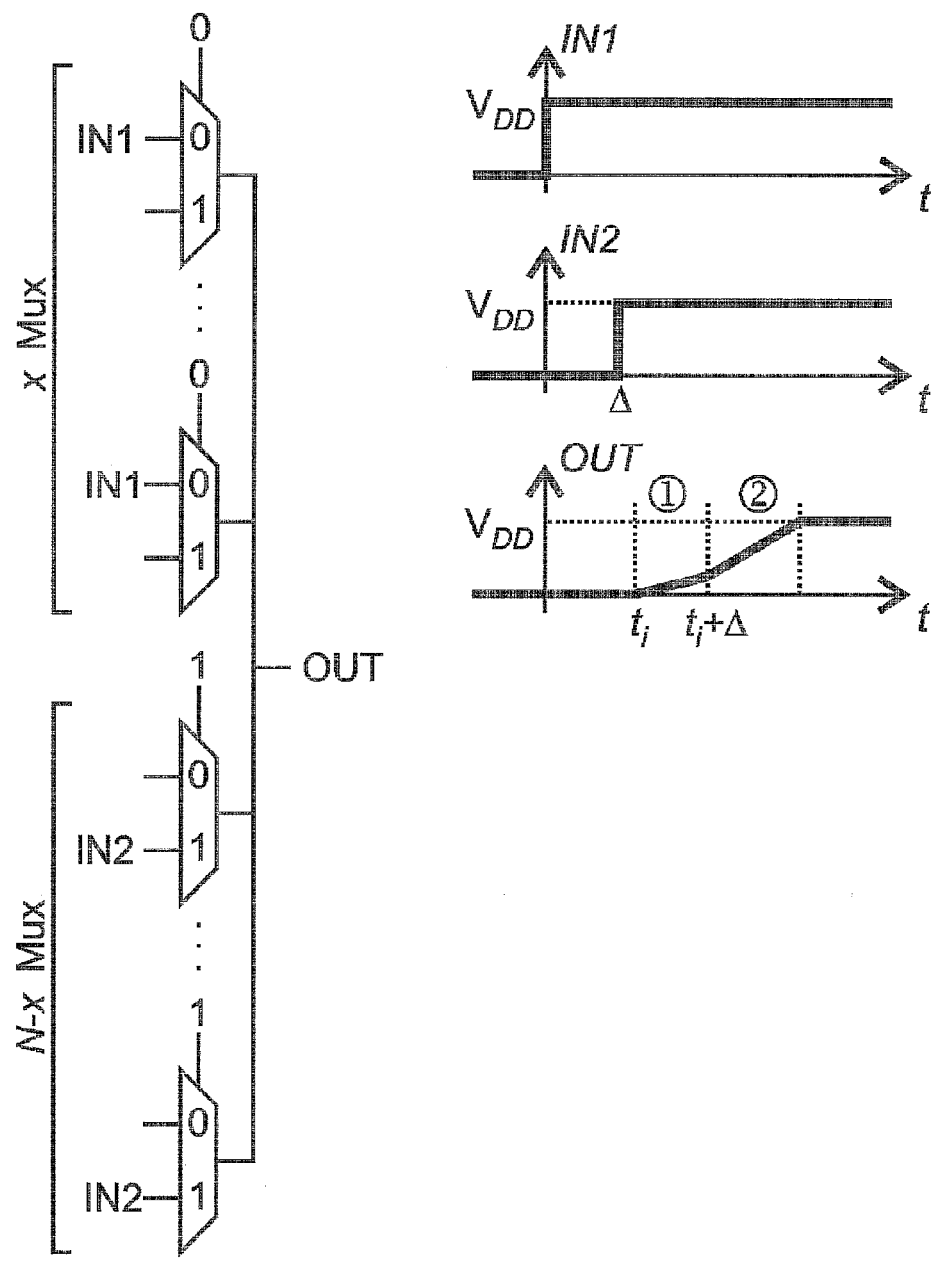
FIG. 5 depicts a connection of N two-input multiplexers according to the present disclosure and shows and relative time graphs.

When a plurality of N identical multiplexers are connected in parallel and selects a same input VIN as shown in FIG. 4, the overall pull-up/pull-down current is multiplied by N. By neglecting the fanout load capacitance of the interpolator, also the overall output capacitance is multiplied by N, the rise-time tr is unchanged and so is the total delay time td. FIG. 5 shows the case in which a step signal VIN1 is selected by a number x of multiplexers and a replica step signal VIN2 delayed by a delay A is selected by the remaining N–x multiplexers. From the instant t=ti up to the instant t=ti+Δ, the overall output capacitance of the parallel connection is N times the output capacitance of a single multiplexer, though it is charged by x multiplexers. Therefore, the output signal VOUT varies substantially according to the following equation:

$$V_{OUT} = V_{DD} \frac{t - t_i}{t_r} \cdot \frac{x}{N},$$

in the hypothesis that the pull-down/pull-up current sunk by the N–x multiplexers is negligible with respect to the pull-up/pull-down current delivered by the x multiplexers. At a time t1=ti+Δ, the output signal VOUT is thus $$V_{OUT}|_{t_1=t_i+\Delta} = V_{DD} \frac{\Delta}{t_r} \cdot \frac{x}{N}.$$

From the instant t1=ti+Δ onwards, all the N multiplexers charge the output capacitance of the parallel connection of multiplexers, thus the output signal VOUT is $$V_{OUT} = V_{OUT}\bigg|_{t_1=t_i+\Delta} + V_{DD} \frac{t - \Delta - t_i}{t_r}.$$

Therefore, if Δ<$t_r$/2, the output VOUT surpasses the intermediate discrimination threshold VDD/2 at a time instant t=td for which $$\frac{V_{DD}}{2} = V_{OUT}\bigg|_{t_1=t_i+\Delta} + V_{DD} \frac{t_d - \Delta - t_i}{t_r},$$

that is $$t_d = t_i + \frac{t_r}{2} + \Delta \cdot \frac{N - x}{N}.$$

The above equation demonstrates that, by connecting in parallel a plurality of multiplexers and applying a same step input signal VIN to an input terminal of x multiplexers controlled to select the input signal VIN, and applying to the remaining N–x multiplexers a replica of the step input signal VIN delayed by a delay Δ<$t_r$/2, the total delay time td of the parallel connection depends linearly on the number x and is between $$t_i + \frac{t_r}{2} \text{ and } t_i + \frac{t_r}{2} + \Delta.$$

It is possible to show that a similar result holds also considering an additional fanout load capacitance of the interpolator.

Figure 6:
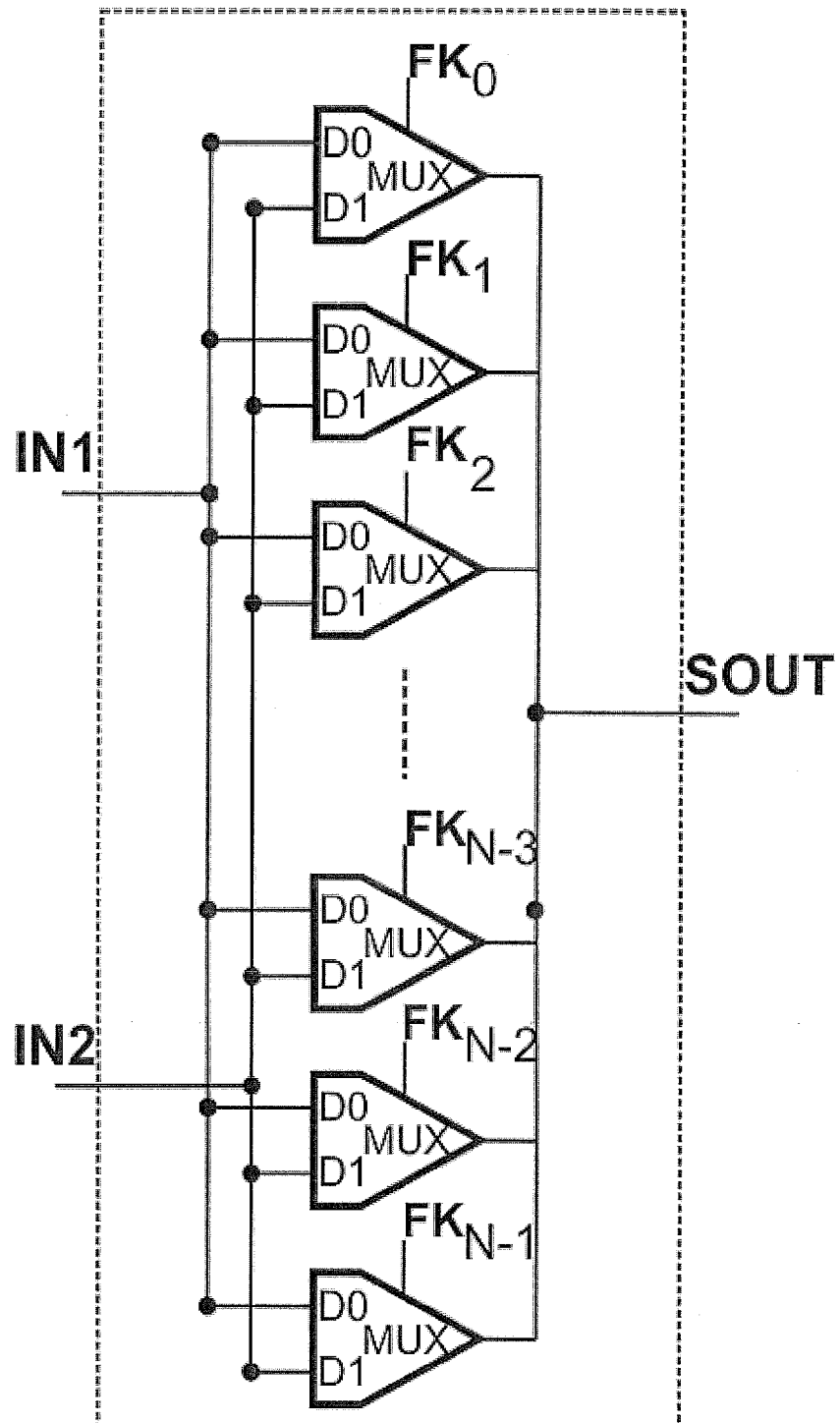
FIG. 6 is an embodiment of a single-stage mux-based digital delay interpolator, according to the present disclosure.

Therefore, it is possible to realize a delay interpolator made only of properly controlled multiplexers connected in parallel to each other, without using inverters. For example, the single-stage digital delay interpolator of FIG. 6 is capable of generating an output SOUT with a delay determined with an accuracy of Δ/N, Δ being the delay between the input signals IN1 and IN2.

Figure 7:
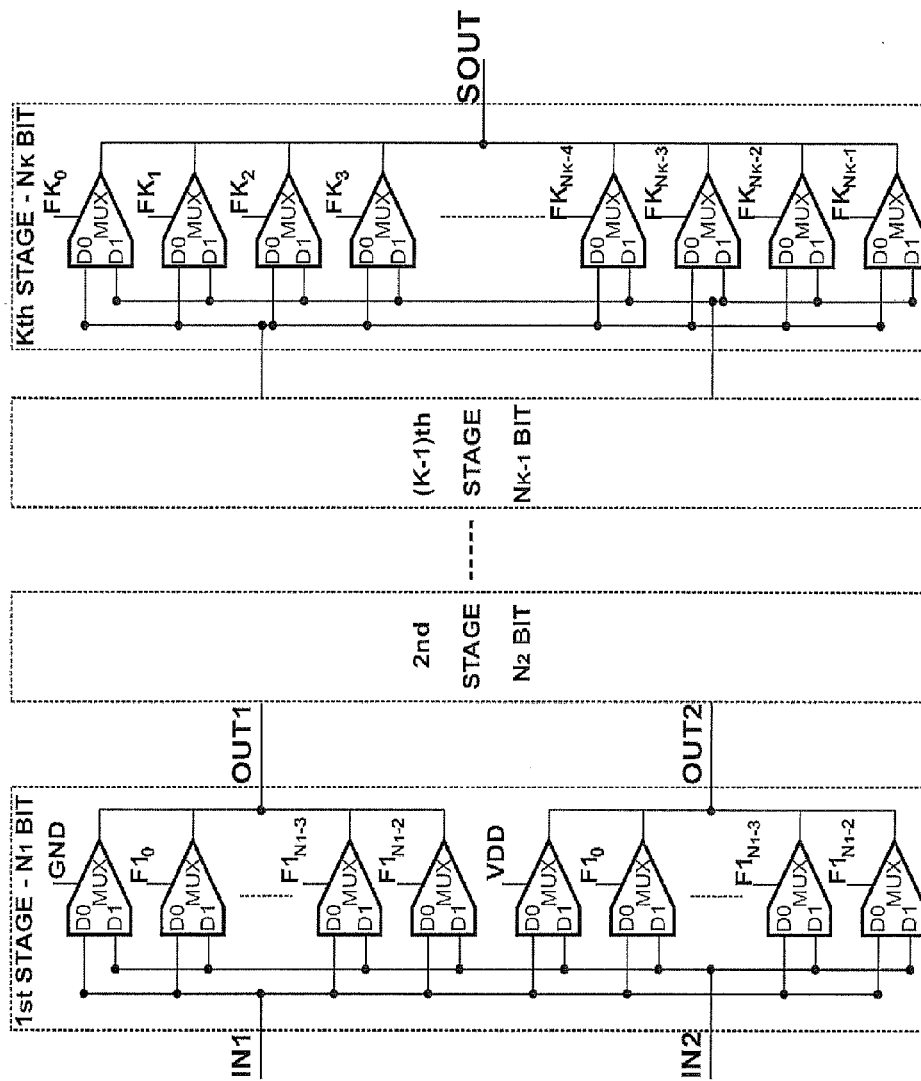
FIG. 7 is an embodiment of a multi-stage mux-based digital delay interpolator, according to the present disclosure.

FIG. 7 depicts a multi-stage mux-based digital delay interpolator, that includes a generic number K of delay stages in cascade. With the exception of last stage, each stage includes two pluralities of Ni 2×1 multiplexers. The two input signals of each multiplexers of the generic i-th stage are the two signals outputted from the previous stage ((i−1)th) having a different phase delay. Both pluralities of multiplexers have outputs connected to each other, thus two signals are outputted from each but the last stage. Control signals are provided to the multiplexers in order to choose the signals in input to the multiplexers to be outputted to the next stage. Being 2·Ni, the number of multiplexers of the generic i-th stage (with the exception of the last stage, comprising NK multiplexers), the overall delay phase resolution (minimum delay step) of the mux-based delay interpolator is given by Δ/N, where N=N1·...·NK.

Figure 8:
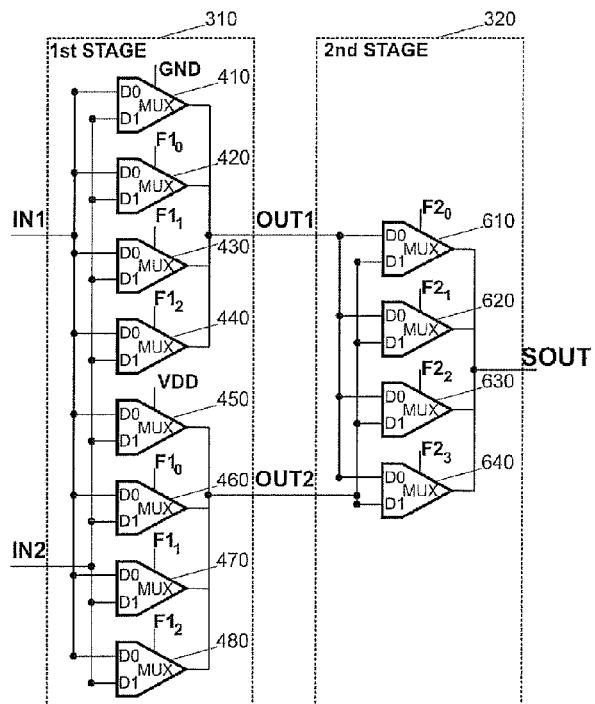
FIG. 8 is an embodiment of a two-stage mux-based digital delay interpolator with N1=N2=4, according to the present disclosure.
Figure 9:
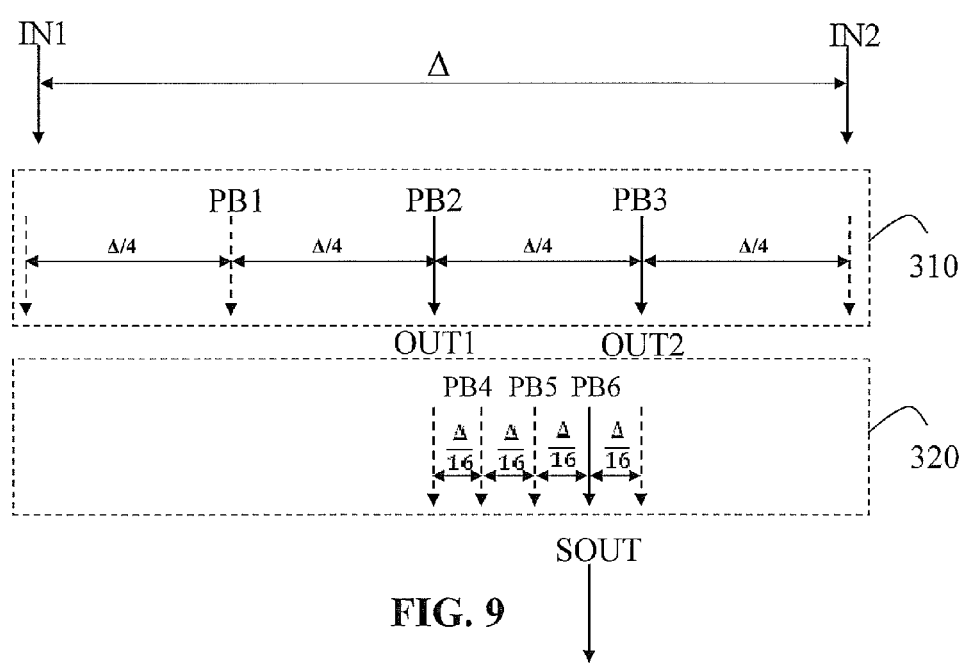
FIG. 9 is a time graph that schematically shows the output signals and other possible blending signals (with dashed line) of the interpolator of FIG. 8.

An exemplary embodiment of a mux-based digital delay interpolator with K=2 (two stages) and N1=N2=4 is shown in FIG. 8. The signals IN1 (phase delay equal to 0) and IN2 (phase delay equal to Δ) are the input signals of the first delay stage 310 in the cascade. Referring to FIG. 8 and FIG. 9, when F10=0, F11=0, F12=0 the signal IN1 is selected by the multiplexers 410, 420, 430, 440, 460, 470, 480 and the signal IN2 is selected by the multiplexer 450, thus, apart a constant delay offset given by ti+tr/2, the output signal OUT2 is the phase mixing signal PB1 with a phase delay equal to Δ/4 and the output signal OUT1 is the selected signal IN1. Therefore, the phase difference between OUT1 and OUT2 is equal to Δ/4.

Referring to FIG. 8 and FIG. 9, when F10=0, F11=0, F12=1, the signal IN1 is selected by the multiplexers 410, 420, 430, 460, 470, and the signal IN2 is selected by the multiplexers 440, 450, 480; thus, apart a constant delay offset given by ti+tr/2, the output signal OUT1 is the phase mixing signal PB1, with a phase delay equal to Δ/4, and the output signal OUT2 is the phase mixing signal PB2 with phase delay equal to Δ/2. The phase difference between OUT1 and OUT2 is equal to Δ/4.

When F10=0, F11=1, F12=1, the signal IN1 is selected by the multiplexers 410, 420, 460, and the signal IN2 is selected by the multiplexers 430, 440, 450, 470, 480; therefore, apart a constant delay offset given by ti+tr/2, the output signal OUT1 is the phase mixing signal PB2 with a phase delay equal to Δ/2 and the output signal OUT2 is the phase blending signal PB3 with phase delay equal to 3Δ/4. The phase difference between OUT1 and OUT2 is equal to Δ/4.

Finally when F10=1, F11=1, F12=1, then the signal IN1 is selected by the multiplexer 410, and the signal IN2 is selected by the multiplexers 420, 430, 440, 450, 460, 470, 480. Therefore, apart a constant delay offset given by ti+tr/2, the output signal OUT1 is the phase mixed signal PB3 with phase delay equal to 3Δ/4, and the output signal OUT2 is the selected signal IN2 (phase delay equal to Δ). The phase difference between OUT1 and OUT2 is equal to Δ/4.

Referring to FIG. 8, the last stage 320 includes only one plurality of multiplexers (610, 620, 630, 640) in order to generate the output signal SOUT of the digital delay interpolator. Let us indicate as Δ2 the phase delay between OUT1 and OUT2, $\Delta_2 = \Delta/4$ according to previous description. The output signal of the final delay stage SOUT is generated in response to the control code bits F20, F21, F22, F23.

To exemplify the operation of the present disclosure, let us assume for the first stage 310, F10=0, F11=1, F12=1 so that, referring to FIG. 8 and FIG. 9, signal OUT1 is the phase mixed signal PB2, and signal OUT2 is the phase mixing signal PB3. When F20=0, F21=0, F22=0, F23=0, the signal OUT1 is selected by all the multiplexers 610, 620, 630, 640, of the last stage, so, apart a constant delay offset given by ti+tr/2, the signal SOUT is the selected signal OUT1.

When F20=0, F21=0, F22=0, F23=1, the signal OUT1 is selected by the multiplexers 610, 620, 630, and the signal OUT2 is selected by the multiplexer 640; in this way, apart a constant delay offset given by ti+tr/2, the signal SOUT is the phase mixing signal PB4 with a phase delay $\Delta_2/4$ from OUT1. When F20=0, F21=0, F22=1, F23=1, the signal OUT1 is selected by the multiplexers 610, 620, and the signal OUT2 is selected by the multiplexers 630, 640. In this way, the signal SOUT, apart a constant delay offset given by ti+tr/2, is the phase mixing signal PB5 with a phase delay $\Delta_2/2$ from OUT1.

Similarly when F20=0, F21=1, F22=1, F23=1, the signal OUT1 is selected by the multiplexer 610, and the signal OUT2 is selected by the multiplexers 620, 630, 640. In this way, the signal SOUT, apart a constant delay offset given by ti+tr/2, is the phase mixing signal PB6 with a phase delay $3\Delta_2/4$ from OUT1.

Finally, when F20=1, F21=1, F22=1, F23=1, the signal OUT2 is selected by all the multiplexers 610, 620, 630, 640, of the last stage; in this way the signal SOUT is, apart a constant delay offset given by ti+tr/2, the selected signal OUT2. Therefore, the interpolator of FIG. 8 allows generating a phase mixing signal SOUT with a resolution (delay step) equal to $\Delta/(N_1 \cdot N_2) = \Delta/16$, using only two delay stages in cascade.

In the architecture of FIG. 8, an eventual mismatch between the two propagation paths of the inputs of the two multiplexers may cause imperfect equally spaced phase mixing signals. This asymmetry may add up among all multiplexers in each stage, thus worsening the integral nonlinearity (INL) of the delay characteristic of the interpolator.

Figure 10:
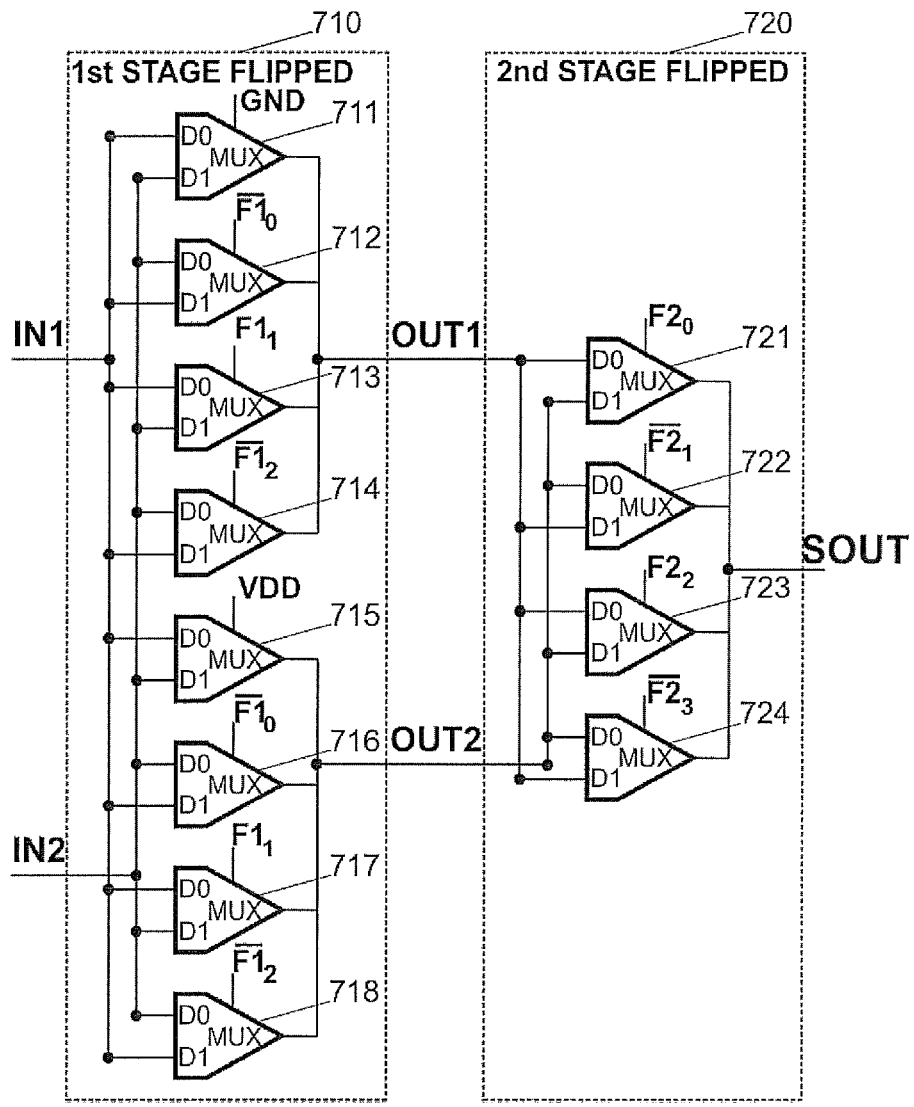
FIG. 10 is an embodiment of a two-stage flipped mux-based digital delay interpolator, according to the present disclosure.

This effect can be reduced by using the flipped stages shown in FIG. 10, wherein the role of the inputs of some of the multiplexers is switched and the respective control signals of the multiplexers are inverted. In this embodiment, the inputs D0 and D1 of multiplexers 711, 713, 715, 717 are connected to IN1 and IN2, respectively, and the inputs D0 and D1 of multiplexers 712, 714, 716 and 718 are connected to IN2 and IN1, respectively. This "flipped" architecture avoids the accumulation of asymmetries among more than just one multiplexer and thus reduces the integral nonlinearity (INL).

Figure 11:
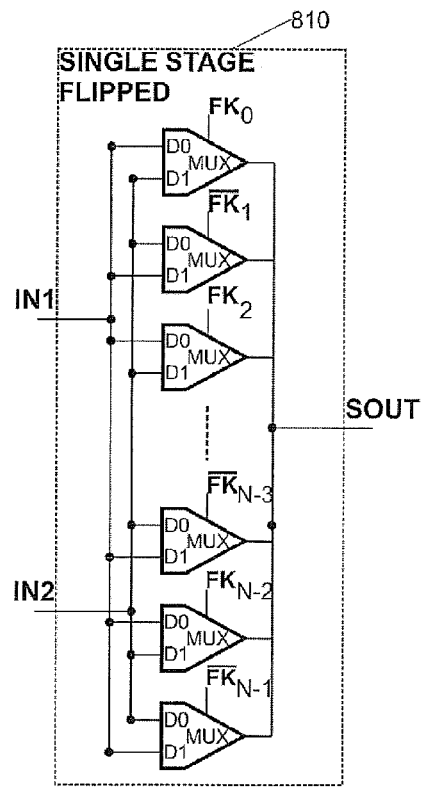
FIG. 11 is an embodiment of a m-bit single stage flipped mux-based digital delay interpolator, according to the present disclosure.
Figure 12:
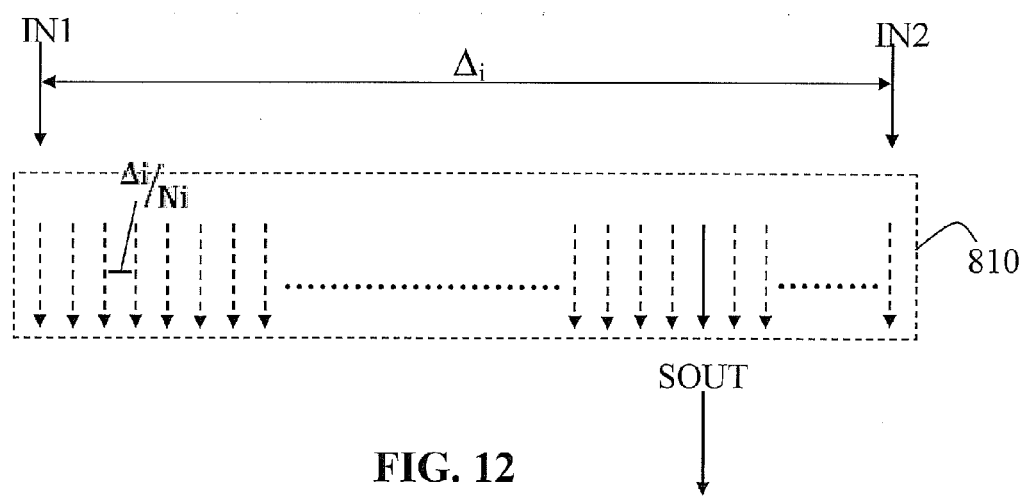
FIG. 12 is a time graph that schematically shows the output signals and other possible blending signals (with dashed line) of the interpolator of FIG. 11.

FIG. 11 shows an embodiment of a Ni-bit flipped single stage MUX-based digital delay interpolator (810) that includes Ni multiplexers. The Ni-bit single stage of delay interpolator allows to generate Ni−1 possible phase mixing signal (FIG. 12) using only one delay stage. The output signal SOUT is a selected signal between the phase mixing signals and the input signals IN1 and IN2 in response to the control signals FK0, FK1, FK2, . . . , FKj, . . . , FKNi−1.

Figure 13:
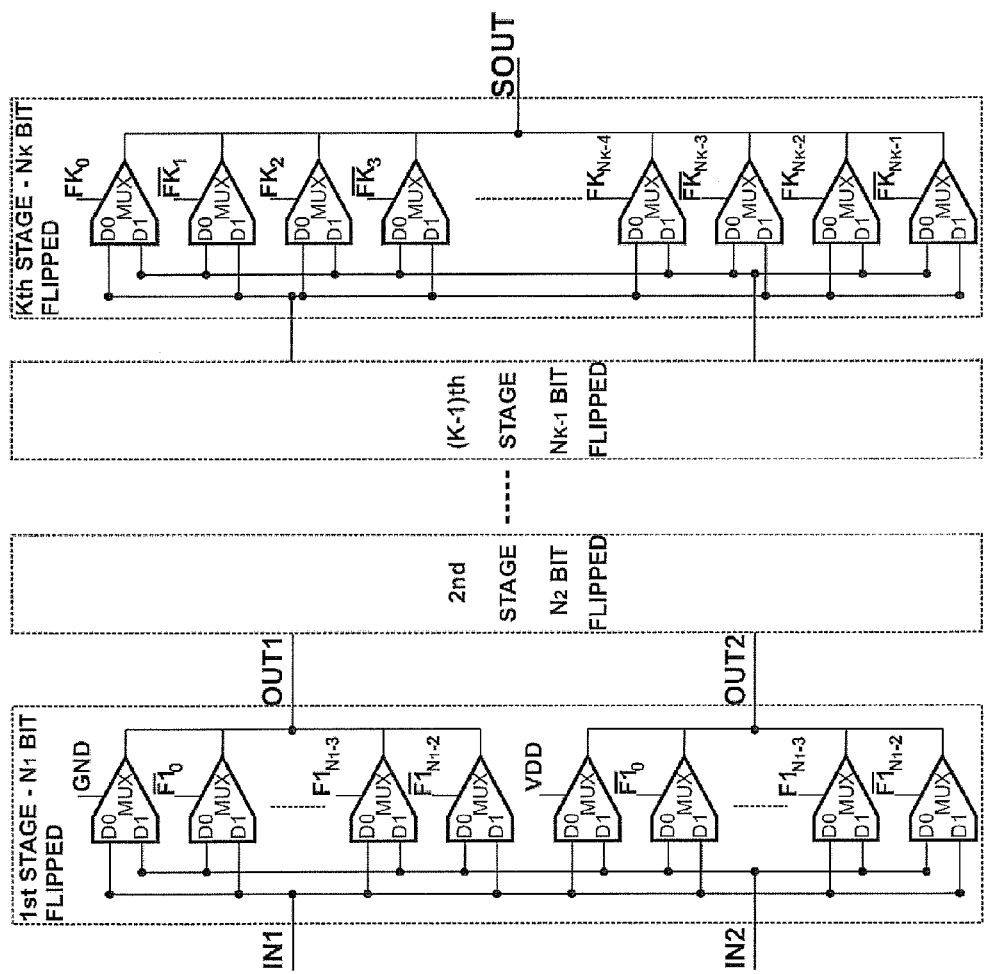
FIG. 13 is an embodiment of a multi-stage flipped mux-based digital delay interpolator, according to the present disclosure.

The "flipped" architecture of the digital delay interpolator may compensate for certain second order effects that increase the INL. For example, the output capacitance on the output of the multiplexers depends upon the values of the control signals of the multiplexers. Moreover, the intrinsic delay time ti and the pull-up/pull-down current of each multiplexer may depend upon the logic value of the respective control signal. In the "flipped" architecture, there are about N/2 multiplexers whose control signal is 0 and about N/2 multiplexers whose control signal is 1. Therefore, the output capacitance of the flipped stage remains substantially constant and the non-linear behavior due to dependence of the intrinsic delay time ti and the pull-up/pull-down currents on the control signals values is substantially reduced. FIG. 13 shows the generalization to the multi-stage case of the flipped single stage MUX-based digital delay interpolator shown in FIG. 11.

That which is claimed is:

1. A digital delay interpolator comprising:
   at least one array of multiplexers, each multiplexer configured to
      be input with first and second input voltages, one of the first and second input voltages being a delayed replica of the other input voltage, and
      receive a respective selection signal;
   a plurality of output lines respectively coupled to said at least one array of multiplexers; and
   an output terminal configured to be coupled in common to said plurality of output lines and output a signal delayed by a time delay value based upon a total output capacitance of a number of multiplexers in said at least one array of multiplexers;
   each multiplexer of said at least one array thereof being configured to selectively output on the respective output line one of the first and the second input voltages based upon a logic value of the respective selection signal.

2. The digital delay interpolator of claim 1 wherein said at least one array of multiplexers comprises a single array of multiplexers to define a single-stage digital delay interpolator.

3. The digital delay interpolator of claim 1 wherein said at least one array of multiplexers comprises a first set, and a second set; wherein each multiplexer of said first set comprises a first input terminal configured to receive the first input voltage, and a second input terminal configured to receive the second input voltage; and wherein each multiplexer of said second set comprises a first input terminal configured to receive the second input voltage, and a second input terminal configured to receive the first input voltage.

4. The digital delay interpolator of claim 1 wherein said at least one array of multiplexers comprises identical multiplexers.

5. The digital delay interpolator of claim 1 wherein said array of multiplexers is coupled in parallel.

6. The digital delay interpolator of claim 1 wherein said output terminal is configured to output the signal delayed by the time delay value without using inverters.

7. A multi-stage digital delay interpolator comprising:
an input phase mixing stage comprising
first and second arrays of multiplexers, each multiplexer configured to
be input with first and second input voltages, one of the first and second input voltages being a delayed replica of the other input voltage, and
receive a respective selection signal;
a plurality of output lines respectively coupled to said first and second arrays of multiplexers,
first and second output terminals,
each multiplexer being configured to selectively output on the respective output line one of the first and the second input voltages based upon a logic value of the respective selection signal, and
a first multiplexer of said first array and a first multiplexer of said second array being configured to output the first input voltage and said second input voltage, respectively,
corresponding multiplexers of said first array and said second array being configured to be controlled by same selection signals,
the respective output lines of the multiplexers of said first array configured to be coupled in common to said first output terminal, and the respective output lines of the multiplexers of said second array configured to be coupled in common to said second output terminal; and
an output phase mixing stage coupled in a cascade with said input phase mixing stage and comprising
a third output terminal,
an array of multiplexers, and
a plurality of output lines respectively coupled to said array of multiplexers,
each multiplexer configured to
be input with first and second output voltages of a preceding phase mixing stage in the cascade,
receive a respective selection signal,
output on the respective output line one of the first and the second output voltages of the preceding phase mixing stage based upon a logic value of the respective selection signal, said plurality of output lines being coupled in common to said third output terminal,
said third output terminal configured to output a signal delayed by a time delay value based upon a total output capacitance of a number of multiplexers in said array of multiplexers.

8. The multi-stage digital delay interpolator of claim 7 further comprising:
at least one intermediate mixing stage coupled in the cascade between said input phase mixing stage and said at least one output phasing mixing stage and including first and second arrays of multiplexers, each multiplexer of said at least one intermediate mixing stage comprising first and second input terminals configured to receive first and second output voltages of said input phase mixing stage, respectively or vice versa;
a plurality of output lines respectively coupled to said first and second arrays of multiplexers of said at least one intermediate mixing stage;
each multiplexer of said first and second arrays of said at least one intermediate mixing stage configured to
receive a respective selection signal, and
selectively output on the respective output line one of said first or second output voltages of said input phase mixing stage based upon a logic value of the respective selection signal;
first and second output terminals,
the respective output lines of the multiplexers of said first array configured to be coupled in common to said first output terminal, and the respective output lines of the multiplexers of said second array configured to be coupled in common to said second output terminal.

9. The multi-stage digital delay interpolator of claim 7 wherein each multiplexer of said first array comprises a first input terminal configured to receive the first input voltage, and a second input terminal configured to receive the second input voltage; and wherein each multiplexer of said second array comprises a first input terminal configured to receive the second input voltage, and a second input terminal configured to receive the first input voltage.

10. The multi-stage digital delay interpolator of claim 7 wherein said array of multiplexers of said output phase mixing stage comprises a first set, and a second set; wherein each multiplexer of said first set comprises a first input terminal configured to receive the first output voltage of the preceding phase mixing, and a second input terminal configured to receive the second output voltage of the preceding phase mixing; and wherein each multiplexer of said second set comprises a first input terminal configured to receive the second output voltage of the preceding phase mixing, and a second input terminal configured to receive the first output voltage of the preceding phase mixing.

11. The multi-stage digital delay interpolator of claim 8 wherein each multiplexer of said first array of said input phase mixing stage comprises a first input terminal configured to receive the first input voltage, and a second input terminal configured to receive the second input voltage; wherein each multiplexer of said second array of said input phase mixing stage comprises a first input terminal configured to receive the second input voltage, and a second input terminal configured to receive the first input voltage.

12. The multi-stage digital delay interpolator of claim 8 wherein said at least one intermediate mixing stage comprises a plurality thereof coupled in cascade between said input and output phase mixing stages and such that a first intermediate stage of the cascade is configured to be input with the first and second output voltages of the input phase mixing stage, each successive phase mixing stage of the cascade being configured to be input with first and second output voltages of the preceding phase mixing stage in the cascade.

13. The multi-stage digital delay interpolator of claim 7 wherein said multiplexers are substantially identical to each other.

14. A method of making a digital delay interpolator comprising:
coupling at least one array of multiplexers, each multiplexer to
be input with first and second input voltages, one of the first and second input voltages being a delayed replica of the other input voltage, and
receive a respective selection signal;
coupling a plurality of output lines respectively to the at least one array of multiplexers; and
coupling an output terminal in common to the plurality of output lines, the output terminal to output a signal delayed by a time delay value based upon a total output capacitance of a number of multiplexers in said at least one array of multiplexers;

each multiplexer of the at least one array thereof to selectively output on the respective output line one of the first and the second input voltages based upon a logic value of the respective selection signal.

15. The method of claim 14 wherein said at least one array of multiplexers comprises a single array of multiplexers to define a single-stage digital delay interpolator.

16. The method of claim 14 wherein the at least one array of multiplexers comprises a first set, and a second set; wherein each multiplexer of the first set comprises a first input terminal to receive the first input voltage, and a second input terminal to receive the second input terminal; and wherein each multiplexer of the second set comprises a first input terminal to receive the second input voltage, and a second input terminal to receive the first input terminal.

17. The method of claim 14 wherein the at least one array of multiplexers comprises identical multiplexers.

18. The method of claim 14 further comprising coupling the at least one array of multiplexers in parallel.

19. The method of claim 14 wherein the output terminal outputs the signal delayed by the time delay value without using inverters.

* * * * *

UNITED STATES PATENT AND TRADEMARK OFFICE
CERTIFICATE OF CORRECTION

| | |
|---|---|
| PATENT NO. | : 8,912,837 B2 |
| APPLICATION NO. | : 14/045284 |
| DATED | : December 16, 2014 |
| INVENTOR(S) | : De Caro et al. |

It is certified that error appears in the above-identified patent and that said Letters Patent is hereby corrected as shown below:

In the Claims

Column 7, Line 59    Delete: "phasing"
Insert: --phase--

Column 9, Line 15    Delete: "input terminal; and"
Insert: --input voltage; and--

Signed and Sealed this
Eighteenth Day of August, 2015

Michelle K. Lee
*Director of the United States Patent and Trademark Office*